United States Patent [19]

Singh

[11] 3,996,573
[45] Dec. 7, 1976

[54] BUBBLE PROPAGATION CIRCUITS AND FORMATION THEREOF

[75] Inventor: Shalendra Kumar Singh, Richardson, Tex.

[73] Assignee: Texas Instruments Incorporated, Dallas, Tex.

[22] Filed: Apr. 21, 1975

[21] Appl. No.: 569,626

[52] U.S. Cl. .................. 340/174 TF; 340/174 BA
[51] Int. Cl.$^2$ ..................................... G11C 11/14
[58] Field of Search ............................. 340/174 TF

[56] References Cited

UNITED STATES PATENTS

| | | | |
|---|---|---|---|
| 3,503,054 | 3/1970 | Bobeck et al. | 340/174 TF |
| 3,797,001 | 3/1974 | Chen et al. | 340/174 TF |
| 3,828,329 | 8/1974 | Fischer et al. | 340/174 TF |
| 3,890,605 | 6/1975 | Sionczewski | 340/174 TF |
| 3,913,079 | 10/1975 | Rosier | 340/179 TF |
| 3,921,157 | 11/1975 | Sandfort | 340/174 TF |
| 3,925,768 | 12/1975 | Lin | 340/174 TF |

Primary Examiner—James W. Moffitt
Attorney, Agent, or Firm—Harold Levine; James T. Comfort; William E. Hiller

[57] ABSTRACT

A magnetic domain memory comprising a planar layer of magnetic material in which magnetic bubbles are moved by a rotating magnetic field in the plane of the layer. At least one circuit or path is provided for guiding the propagation of the bubbles in the layer. This path comprises an overlay pattern of magnetically soft material the periphery of which defines the travel of the bubbles. The surface area of the layer bounding the outside of the overlay pattern comprises an ion-implanted region. This magnetic bubble propagation circuit is made by forming a thin film pattern of a magnetically soft material, such as permalloy, on the surface of a layer of magnetic material, and then directing at the surface of this layer ions having a sufficiently high energy level so as to effect implantation thereof in the lattice structure of the magnetic layer while utilizing the pattern of magnetically soft material to block the ions from penetration of the magnetic layer underlying the pattern.

14 Claims, 5 Drawing Figures

BUBBLE PROPAGATION CIRCUITS AND FORMATION THEREOF

BACKGROUND OF THE INVENTION

This invention relates to magnetic bubble propagation circuits and to methods for forming such circuits.

Magnetic domain memories include one or more memory storage loops, accommodating a number of magnetic single wall domains or bubbles, each of which represents one bit of binary information. These bubbles are rotated about the loop in a synchronized and controlled manner so that access can be gained to the stored information. A number of different approaches have been utilized in the formation of these bubble paths or circuits. Typically, in field accessed systems a path or track is established by laying down a pattern of a series of thin film permalloy tiny geometric shapes or circuit elements so that as an in-plane magnetic drive field is rotated the elements are sequentially polarized plus and minus to cause the propagation or step-wise movement of the bubbles along the path. Widely used bubble mover circuit elements are alternating T and bar shapes, alternating Y and bar shapes, and chevron shapes.

While these bubble mover circuit elements function satisfactorily, the small size of these circuit elements used for magnetic bubbles of the typical 5 micron size and the precision with which these elements must be applied, strains the limits of existing masking and photolithographic techniques. Thus at higher bit densities and higher drive speeds, these permalloy alternating circuit element tracks tend to be unreliable and unsatisfactory. In order to increase bit density or information storage capacity per unit wafer or chip area and relative speed as the bubbles are propagated through typical memory registers, attention is being directed to reducing the domain size into the submicron range. This, of course, raises severe difficulties in the masking and photolithography of the circuit element structures to reliably provide precisely shaped and spaced circuit elements for the drive track.

Ion-implanted patterns in garnet films have also been employed (Wolfe et al., AIP Conference Proc. No. 10, 1972, p. 339) for field-access bubble propagation tracks. These patterns avoid the use of small geometry wherein the bubble path is formed of discrete tiny spaced circuit elements of soft magnetic material. Instead gross geometry may be utilized by employing a mask to ion-implant a continuous elongate pattern with a generally serrated or wavy edge along which the domains are propagated. Such gross geometry ion-implanted patterns, however, have certain disadvantages such as producing relatively mild pole strengths when an inplane field is applied which gives rise to smaller propagation margins at high rates of drive field rotation. This leads to failure to have the bubble reliably propagate or to propagate at all.

SUMMARY OF THE INVENTION

Among the several objects of the present invention is the provision of magnetic domain memories which avoid the use of small geometry in forming the bubble propagation circuit or paths; the provision of such memories in which only gross geometry patterns are utilized for formation of the tracks and are particularly useful in small-bubble memory registers; the provision of such bubble tracks which insures reliable bubble propagation at high rates of rotation of an in-plane magnetic field; and the provision of methods for economically forming such bubble propagation circuits with a reduced number of processing operations and utilizing only a single masking step.

Briefly, the invention comprises a magnetic domain memory in which magnetic bubbles can be moved in a planar layer of magnetic material by a rotating magnetic field in the plane of the layer. At least one path is provided for guiding the propagation of these bubbles. This path comprises an overlay pattern of magnetically soft material the periphery of which defines the travel of the bubbles while the surface area of the layer bounding the outside of said overlay pattern comprises an ion-implanted region.

Such novel bubble propagation circuits are fabricated in accordance with this invention by forming a thin film pattern of a magnetically soft material on the surface of the planar layer of magnetic material and then directing at the surface of this layer ions having a sufficiently high energy level so as to effect implantation thereof in the lattice structure of the layer while utilizing the pattern of magnetically soft material to block the ions from penetration of the magnetic layer underlying the pattern whereby a circuit path defined by the periphery of the pattern and bounded on the outside by an ion-implanted region is thereby formed. Other objects and features will be in part apparent and in part pointed out hereinafter.

BRIEF DESCRIPTION OF THE DRAWINGS

Corresponding reference characters indicate corresponding parts throughout the several views of the drawings.

DESCRIPTION OF PREFERRED EMBODIMENTS

Figure 1:
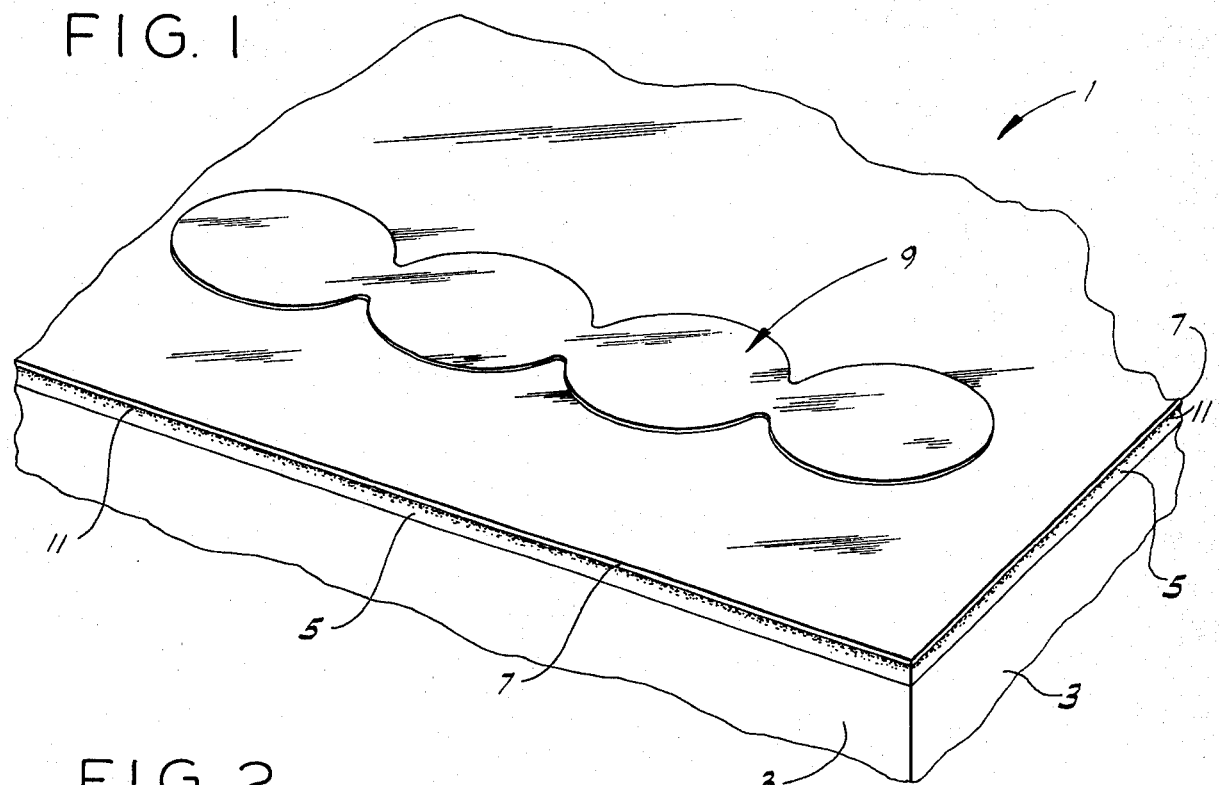
FIG. 1 is a perspective view of a portion of a magnetic bubble memory chip illustrating a propagation circuit of the present invention.
Figure 3:
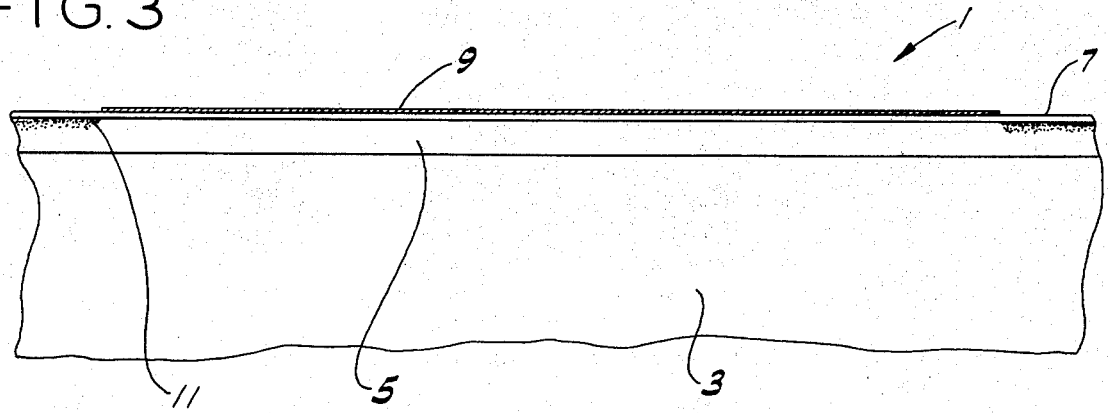
FIG. 3 is a section on line 3—3 of FIG. 2.

Referring now to FIG. 1, a portion of a magnetic domain or bubble memory chip or wafer is indicated generally at 1. It comprises an oriented slice cut from a single crystal of rare earth garnet or equivalent material with a substrate portion 3 having a planar bubble layer 5 possessing uniaxial anisotropy. Typically substrate 3 is nonmagnetic rare earth garnet and film or layer 5 is an epitaxially deposited garnet layer in the order of about 5 microns in thickness and having an easy magnetization in a direction perpendicular to the plane of the layer. A spacing layer 7 of silicon dioxide, for example, in the order of 0.5–1 micron in thickness is interposed between magnetic bubble layer 5 and a bubble propagation circuit 9 comprising a thin (e.g., 400–5,000A) overlay film pattern of a magnetically soft material such as permalloy, a nickel-iron alloy. As is indicated more particularly in FIG. 3, the upper portion of layer 5 (except under pattern 9) has been ion-implanted by conventional techniques known to those in this art to form a thin film portion 11, say 0.5 to 1 micron in depth, in which the crystal lattice structure has been altered. The bombarding ions cause a local expansion in this garnet layer which effects a lateral compression. This changes the magnetic properties of the material so that in the implanted portion 11 the totan anisotropy is overcome and the direction of easy magnetization in the implanted upper film portion 11 will be parallel to the chip surface.

Figure 2:
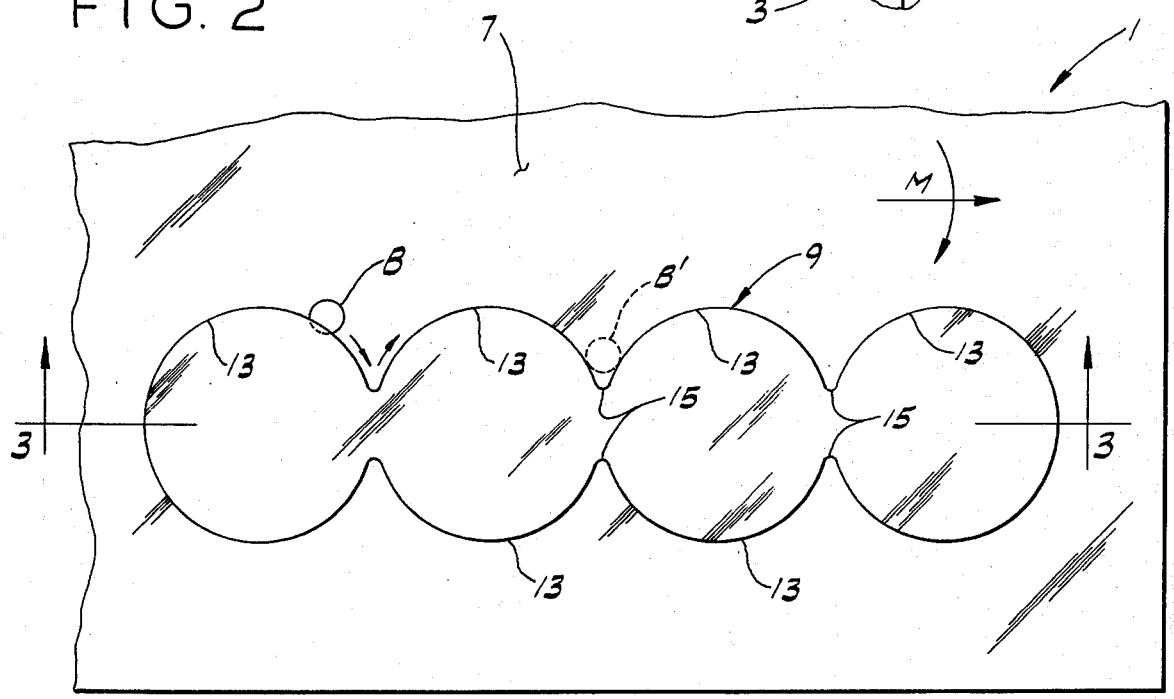
FIG. 2 is a plan view of the chip portion of FIG. 1.

When, as indicated in FIG. 2, chip 1 is subjected to a rotating in-plane magnetic drive field M (assuming the presence of the usual bias field perpendicular to the plane of bubble layer 5 to maintain the bubble at the desired nominal size), magnetic bubbles such as indicated at B will be propagated or travel along a path defined by the periphery of the permalloy gross geometry pattern of track or circuit 9 due to the poles produced by the permalloy and ion implantation. If the direction of rotation of drive field M is as indicated in FIG. 2, bubble B will travel or propagate to the right, or clockwise, as indicated, moving one curved segment for each 360° of rotation of the drive field. During one half or 180° of the drive field rotation, the bubbles will be held in a stable position in the cusps as indicated at B'.

Preferably the permalloy overlay pattern 9 comprises an area encompassed by a continuous interconnected series of curved segments 13 so that the periphery of the pattern is an elongate loop path of alternating curved segments 13 and cusps 15. More particularly, it is preferred that the pattern be constituted by a row or series of adjoining circles, either substantially tangent or somewhat overlapping, the periphery of which defines a closed-loop path, and the junctions of curved segments constituting the cusps. The bubble propagation under the influence of the rotating drive field and along the curved portions of the periphery of the permalloy pattern is mostly because of the poles induced in the permalloy. However, in circuits using just the permalloy pattern and without the bordering implantation area, the cusps would present an unstable position for the bubbles. The ion-implantation boundary region improves the stability of the bubble in the cusp regions. The circuit parameters may be varied and optimized by changing the thickness of the permalloy film pattern 9 thereby controlling the pole-strengths to the desired value.

In accordance with the method of this invention the surface of the magnetic garnet layer 5, after deposit of the silicon dioxide layer 7, has a film of the soft magnetic material applied in the desired thickness. The pattern area is then masked by conventional techniques and the exposed magnetic material is then etched away by customary means thereby exposing the surface of the magnetic garnet layer 5 with the overlying silicon dioxide film 7 except under the pattern area. The metal film pattern 9 then constitutes a mask to block the implantation of ions in the region therebeneath.

Conventional ion-implantation techniques may be used in bombarding the exposed chip surface. Thus hydrogen, helium or neon ions of 100–150 keV energy levels, for example, may be used to implant about $3 \times 10^{16}$ ion/cm$^2$. An exemplary penetration of about 0.5 micron or so using hydrogen protons has been utilized to form the implanted surface region 11. This simplified processing, using only one masking step, eliminates any registration problems in multiple masking and provides a bubble layer with a planar surface with excellent definition at the interface between the pattern edge and the boundary of ion-implanted region 11. It will be understood that a variety of circuit designs and patterns may be formed and that, in producing these, one mask may be used for the permalloy and another for ion-implantation.

Figure 4:
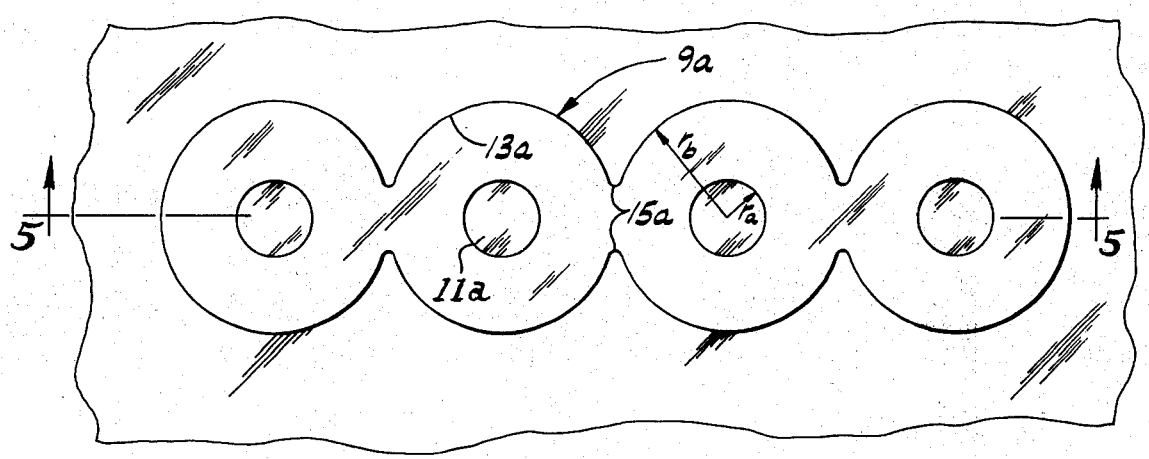
FIG. 4 is a plan view of another embodiment of the present invention.
Figure 5:
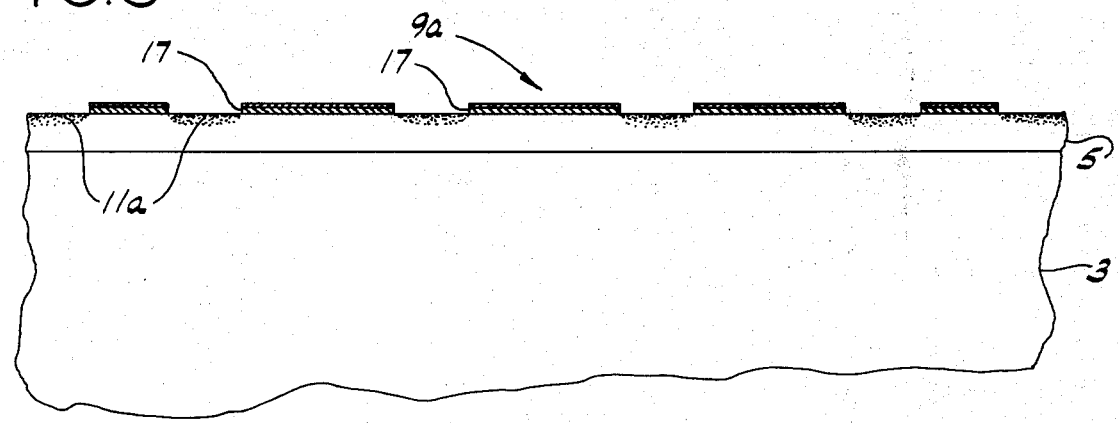
FIG. 5 is a section on line 5—5 of FIG. 4.

In FIG. 4 another circuit embodiment of this invention is illustrated. Here, instead of a row of substantially tangent circles, a pattern 9a constituted by a series or row of contiguous or adjoining rings or annuli (substantially tangent or somewhat overlapping) is formed from soft magnetic material such as permalloy. It is to be noted that the bubble track is again the periphery of this pattern which is made up of a series of interconnected curved segments 13a alternating with cusps 15a. Another difference between the first embodiment of FIGS. 1—3 and that of FIGS. 4 an 5 is the use of a thin film 17 of gold as a spacer layer interposed between the permalloy pattern 9a and the underlying ion-implanted surface region 7 of the magnetic garnet layer 5. The gold layer is, for example, 5,000–10,000A thick and may be applied over the entire surface of magnetic garnet layer 5 as a preliminary to to depositing the film of permalloy. After masking over the pattern area, both the gold and permalloy are removed by conventional etching procedures leaving a two-layer pattern 9a. The gold not only functions as a spacer layer but supplements the ion-blocking function of the overlying permalloy during subsequent ion bombardment, which in this embodiment will form ion-implanted regions 11a in the small circular surface area of the magnetic garnet under the pattern openings as well as in the balance of the exposed area of layer 5. It will be noted, however, that a silicon dioxide spacer film may be utilized in this embodiment in place of or in addition to the gold film. Moreover it will be understood that the gold layer used in the embodiment shown in FIGS. 4 and 5 may be used in a similar way in the embodiment of FIGS. 1–3 either in place of or in addition to the silicon dioxide layer 7.

The pattern 9a provides additional versatility in design parameters in that not only may pole-strengths be varied to optimize them by adjusting the thickness of the permalloy film, but also the gold film 17 may be modified in thickness for this purpose. Additionally, the pole-strengths in the FIGS. 4, 5 embodiment may be varied by adjusting the radii $r_a$ of the openings of pattern 9a relative to the outer radii $r_b$. Again in this bubble propagation circuit the surface of the bubble film or layer 5 with its upper ion-implanted regions 11a remains planar and the simplified processing utilized in its fabrication uses the overlay pattern 9a both as providing on its periphery the bubble circuit or path and as serving as a mask with excellent definition which blocks ion penetration in the desired areas.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A magnetic bubble domain structure comprising: a planar layer of magnetic material in which magnetic bubbles can be moved; and at least one bubble propagation path defined on a major surface of said planar magnetic layer for guiding the movement of said bubbles in said layer in response to a change in orientation of a rotary magnetic field within the plane of said layer, said path including an overlay pattern of magnetically soft material disposed on said major surface of said planar magnetic layer, an ion-implanted region in the upper surface portion of said major surface of said planar magnetic layer forming a border along the periphery of said overlay pattern of magnetically soft material, and the periphery of said overlay pattern of magnetically soft material serving as a bubble-guiding track along said path.

2. A magnetic bubble domain structure as set forth in claim 1 in which the magnetically soft material is a film of permalloy and a thin film of silicon dioxide is interposed between the overlay pattern of permalloy and said major surface of said planar magnetic layer.

3. A magnetic bubble domain structure as set forth in claim 2 in which the permalloy film has a thickness of the order of about 400 to 5,000 A.

4. A magnetic bubble domain structure as set forth in claim 1 in which the magnetically soft material is a film of permalloy and a thin film of gold is interposed between the overlay pattern of permalloy and said major surface of said planar magnetic layer.

5. A magnetic bubble domain structure as set forth in claim 4 in which the thickness of the gold film is of the order of about 5,000 to 10,000 A.

6. A magnetic bubble domain structure as set forth in claim 1 in which the overlay pattern of magnetically soft material comprises an area encompassed by a continuous interconnected series of curved segments, the periphery of said overlay pattern of magnetically soft material defining an elongate loop path of alternating curved segments and cusps.

7. A magnetic bubble domain structure as set forth in claim 6 in which the overlay pattern of magnetically soft material comprises a row of adjoining tangent circles, the periphery of which defines an elongate closed-loop path.

8. A magnetic bubble domain structure as set forth in claim 6 in which the overlay pattern of magnetically soft material comprises a row of adjoining annuli, the periphery of which defines an elongate closed-loop path, and respective circular ion-implanted regions in the upper surface portion of said major surface of said planar magnetic layer within each annulus of magnetically soft material included in said row of adjoining annuli.

9. In a magnetic bubble domain memory having a planar layer of magnetic material in which magnetic bubbles can be moved, and means for generating a rotating magnetic field in the plane of the layer to cause movement of the bubbles therein; a magnetic bubble propagation circuit defined on a major surface of said planar magnetic layer for guiding the movement of said bubbles in said layer in response to a change in orientation of the rotating magnetic field within the plane of said layer, said bubble propagation circuit including an overlay pattern of magnetically soft material disposed on said major surface of said planar magnetic layer, an ion-implanted region in the upper surface portion of said major surface of said planar magnetic layer forming a border along the periphery of said overlay pattern of magnetically soft material, and the periphery of said overlay pattern of magnetically soft material serving as a bubble-guiding track along said bubble propagation circuit.

10. A method for forming a magnetic bubble propagation circuit comprising: forming a thin film pattern of a magnetically soft material on a major surface of a planar layer of magnetic material in which bubbles can be moved; and directing at the major surface of the magnetic layer ions having a sufficiently high energy level so as to effect implantation thereof in the lattice structure of the upper surface portion of the major surface of the magnetic layer while utilizing the pattern of magnetically soft material to block the ions from penetration of the major surface portion of the magnetic layer underlying the pattern whereby a circuit path providing a bubble-guiding track defined by the periphery of the pattern of magnetically soft material and an ion-implanted region bordering the periphery of the pattern of magnetically soft material is thereby formed.

11. A method as set forth in claim 10 wherein the thin film pattern is formed by depositing the magnetically soft material on the said major surface of the magnetic layer, masking the pattern area, and removing by etching the unmasked magnetically soft material thereby exposing the said major surface of the magnetic layer for ion-implantation except in the area covered by the pattern of magnetically soft material.

12. A method as set forth in claim 11 wherein the pattern of magnetically soft material is so formed as to comprise an area encompassed by a continuous interconnected series of curved segments, the periphery of said pattern of magnetically soft material defining an elongate loop path of alternating curved segments and cusps.

13. A method as set forth in claim 10 further including depositing a thin spacing layer of silicon dioxide over the entire said major surface of the planar layer of magnetic material prior to formation of the pattern of magnetically soft material thereon.

14. A method as set forth in claim 11 further including depositing a thin film of gold over the entire said major surface of the planar layer of magnetic material prior to the deposit thereon of the magnetically soft material, and thereafter masking the pattern area such that etching the unmasked material removes a portion of both the magnetically soft material and the gold film.

* * * * *